United States Patent
Wu

(10) Patent No.: US 6,940,769 B2
(45) Date of Patent: Sep. 6, 2005

(54) METHOD OF DRIVING AND TESTING A SEMICONDUCTOR MEMORY DEVICE

(75) Inventor: Shun-Ker Wu, Taoyuan County (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 10/775,606

(22) Filed: Feb. 10, 2004

(65) Prior Publication Data

US 2005/0063229 A1 Mar. 24, 2005

(30) Foreign Application Priority Data

Sep. 18, 2003 (TW) .......................... 92125696 A

(51) Int. Cl.⁷ ................................. G11C 7/00
(52) U.S. Cl. .................... 365/201; 365/189.01
(58) Field of Search ........................ 365/201, 189.01, 365/230.06, 230.08, 149, 189.11

(56) References Cited

U.S. PATENT DOCUMENTS

| | | | |
|---|---|---|---|
| 5,258,954 A | | 11/1993 | Furuyama |
| 5,495,448 A | * | 2/1996 | Sachdev ...................... 365/201 |
| 5,544,123 A | * | 8/1996 | Hoshi et al. ................ 365/201 |
| 5,619,460 A | * | 4/1997 | Kirihata et al. ............ 365/201 |
| 5,999,466 A | * | 12/1999 | Marr et al. ................. 365/201 |
| 6,349,065 B1 | * | 2/2002 | Ooishi ........................ 365/201 |
| 2004/0042312 A1 | * | 3/2004 | Kim et al. .................. 365/222 |

* cited by examiner

*Primary Examiner*—Gene N. Auduong
(74) *Attorney, Agent, or Firm*—Quintero Law Office

(57) ABSTRACT

A method of driving and testing a semiconductor memory device. First, a plurality of word lines controlled by a driving line is selected by a testing unit, then, a control line coupled to the word lines is enabled by a testing unit. Next, the driving line was enabled. Finally, the driving signal is transferred through the control lines to the word lines.

6 Claims, 3 Drawing Sheets

METHOD OF DRIVING AND TESTING A SEMICONDUCTOR MEMORY DEVICE

BACKGROUND OF THE INVENTION

1. Field of the Invention

The present invention relates to method of testing a semiconductor device, and more particularly, to a method of driving and testing word lines of a dynamic random access memory.

2. Description of the Related Art

Semiconductor memories such as dynamic random access memories have millions of memory cells. As shown in FIG. 1, every memory cell MC has a transistor T and a capacitor C, a gate terminal of the selected transistor T is controlled by a word line WL. When the word line WL is selected, the corresponding transistor T will be turned on. Then, The electric charge storied in the capacitor is sent to the bit line BL and sense amplifier SA, after compares on by the sense amplifier SA, the amplifier SA outputs a logic 0 or logic 1 signal. The logic 0 or logic 1 signal represents the data stored in the memory cell MC. Finally, the output signal is read by the I/O data line.

FIG. 2 shows a driving circuit of a DRAM, showing how to turn on a predetermined word line. A driving circuit of a word line is composed of two PMOS transistors $P_1$ and $P_2$. the PMOS $P_2$ is a backup transistor. When a word line $WL_0$ is selected, a control signal of a control line $D_{out}$ will be pulled down to a low potential level by a testing unit 11, and a driving signal of a driving line WLDV will be raised to a high potential level $V_{pp}$. When the PMOS transistors $P_1$ and $P_2$ are switched on, the driving signal $V_{pp}$ is sent to the word line $WL_0$ through PMOS transistor $P_1$. When a precharge commend is proceeded by the testing unit 11, the control signal of the control line DOUT will be raised to a high potential level, the driving signal of the driving line WLDV will be pulled down from high potential level to low potential level ($V_{GND}$), and the word line will WL0 be turned off.

FIG. 3 shows a schematic layout diagram, which shows a plurality of driving circuits corresponding to a block of word lines in a DRAM, according to FIG. 3, there are 16 word lines $WL_0 \sim WL_F$ in the picture. Every word line in the memory is driven by a corresponding driving circuit, and the driving circuits 10 are controlled by control lines DOUT0~DOUT3 and driving lines WLDV0~WLDV3 to turn on or turn off the word lines $WL_0 \sim WL_F$. For example, the control line DOUT0 is coupled to the driving circuits 10 of the first to the fourth word lines $WL_0 \sim WL_3$ of the block word lines $WL_0 \sim WL_F$. The connection of the remaining word lines are the same and the description is omitted here. When the control line DOUT0 and the driving line WLDV0 is turned on, the word line $WL_0$ is turned on.

In the conventional method, only one control line and one driving line can be turned on in a block of DRAM. First, a control line DOUT0 and a driving line WLDV0 is enabled, meaning the control signal of the control line DOUT0 is pulled down to a low potential level and the driving line is pulled to a high voltage level. After a delay time, a precharge commend is proceeded to close and disable the word line $WL_0$, the control line $WL_0$ and the driving line WLDV0, the control signal of the control line DOUT0 is pulled high and the driving signal of the driving line pulled low. Next, a following word line is turned on in the same way. Hence only one word line in a block word lines is turned on at one time. This method is time consuming when turning on all the word lines in a DRAM, causing throughput to suffer.

SUMMARY OF THE INVENTION

Accordingly, an object of the present invention is to provide a method by which more word lines can be turned on in a block at the same time. Thus reducing testing time and increasing throughput.

In order to achieve the above object, the invention provides a method of driving and testing a semiconductor memory device.

First, a plurality of word lines controlled by a driving line is selected by a testing unit, then, a control line coupled to the word lines is enabled by a testing unit. Next, The driving line was enabled. Finally, the driving signal is transferred through the control lines to the word lines.

A detailed description is given in the following with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 4:
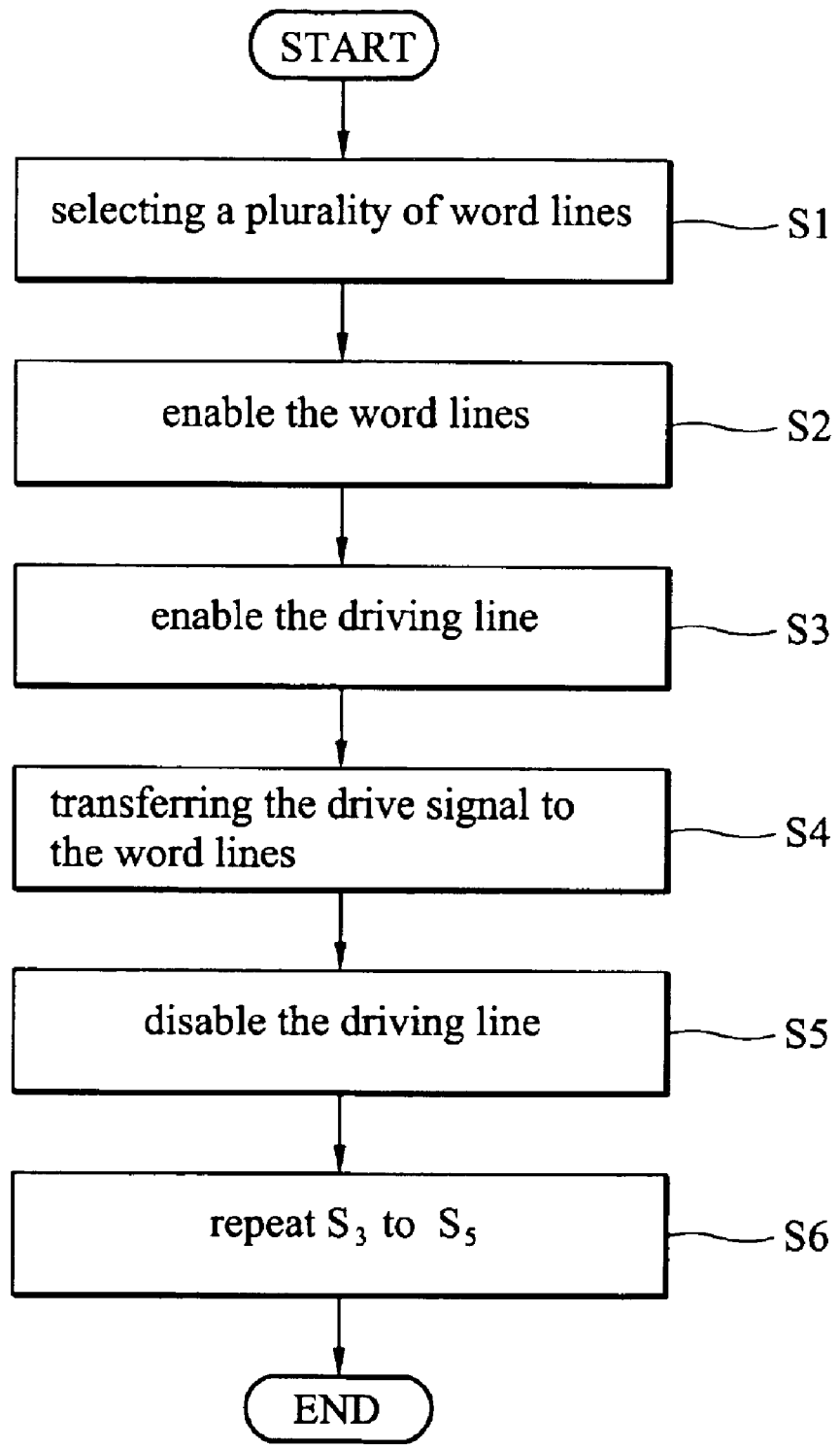
FIG. 4 shows a process flow of the embodiment of the present invention.

FIG. 4 shows a process flow of the embodiment of the present invention.

In step S1, a test mode is entered, and a plurality of word lines is selected by the testing unit, wherein the word lines are coupled to the same driving line.

Next, in step S2, control lines coupled to the word lines are enabled by the testing unit. In the case of the present invention, the voltage signal of the control lines is pulled to a low potential level to enable the control lines coupled to the plurality of word lines.

Thereafter, in step S3, a command is executed to turn on one of the word lines, the driving line is enabled to turn on one of the word lines. In the case of the present invention, the voltage signal of the driving line is raised from a low potential level to a high potential level.

Next, in step S4, a driving signal is transferred through the control lines to the corresponding word lines, and the selected word lines are turned on. In step S5, the word line is turned off by the testing unit, the driving line is disabled; the control line is still in an enabled state. In the case of the present invention, the driving signal of the driving line is pulled to a low potential level, but the control signal of the control line is still at a low potential level.

Finally, in step S6, the aforementioned steps 3 to 5 are repeated, so that the selected word lines will be turned on or off repeatedly.

Figure 1:
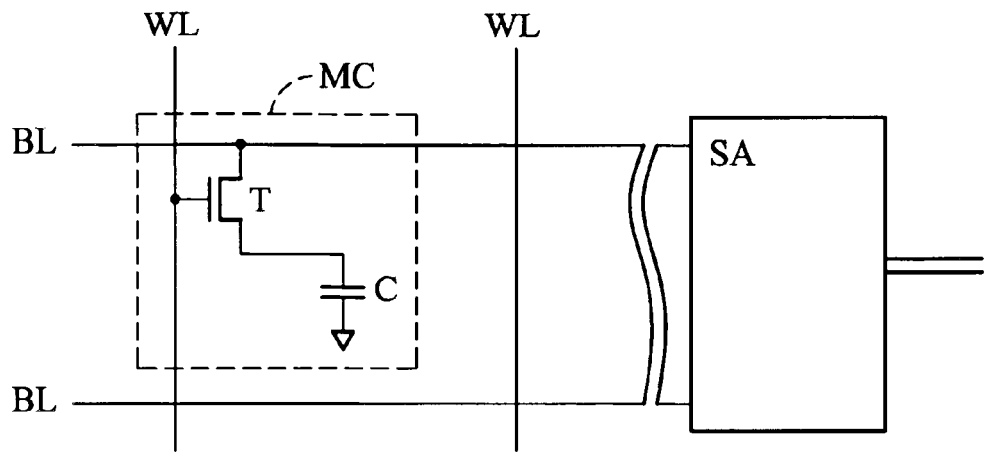
FIG. 1 shows a schematic of a circuit of a memory cell of a memory device.
Figure 2:
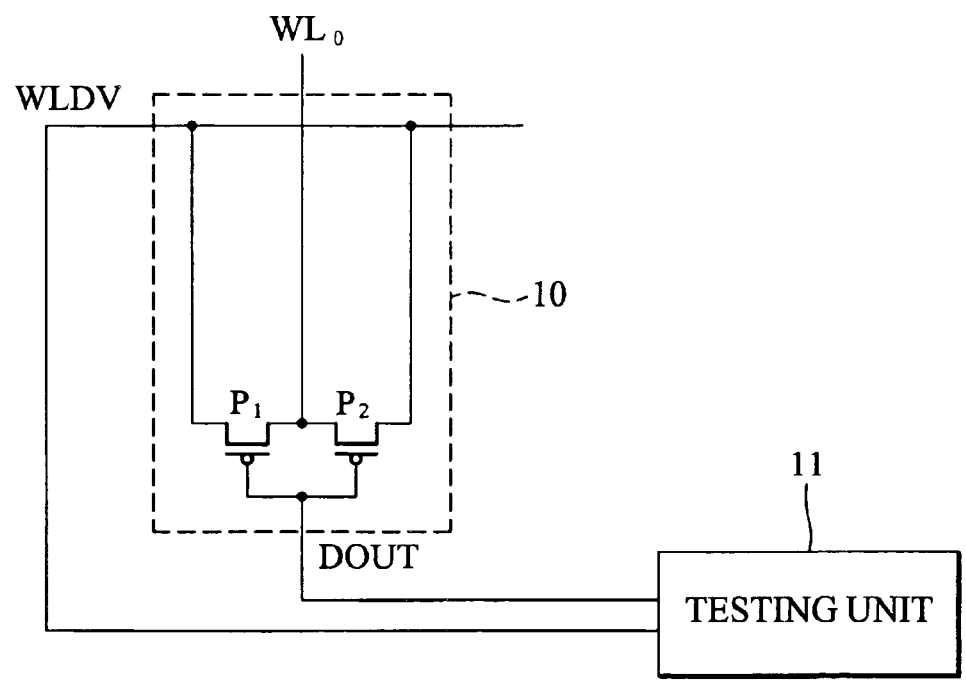
FIG. 2 shows a driving circuit of a DRAM.
Figure 3:
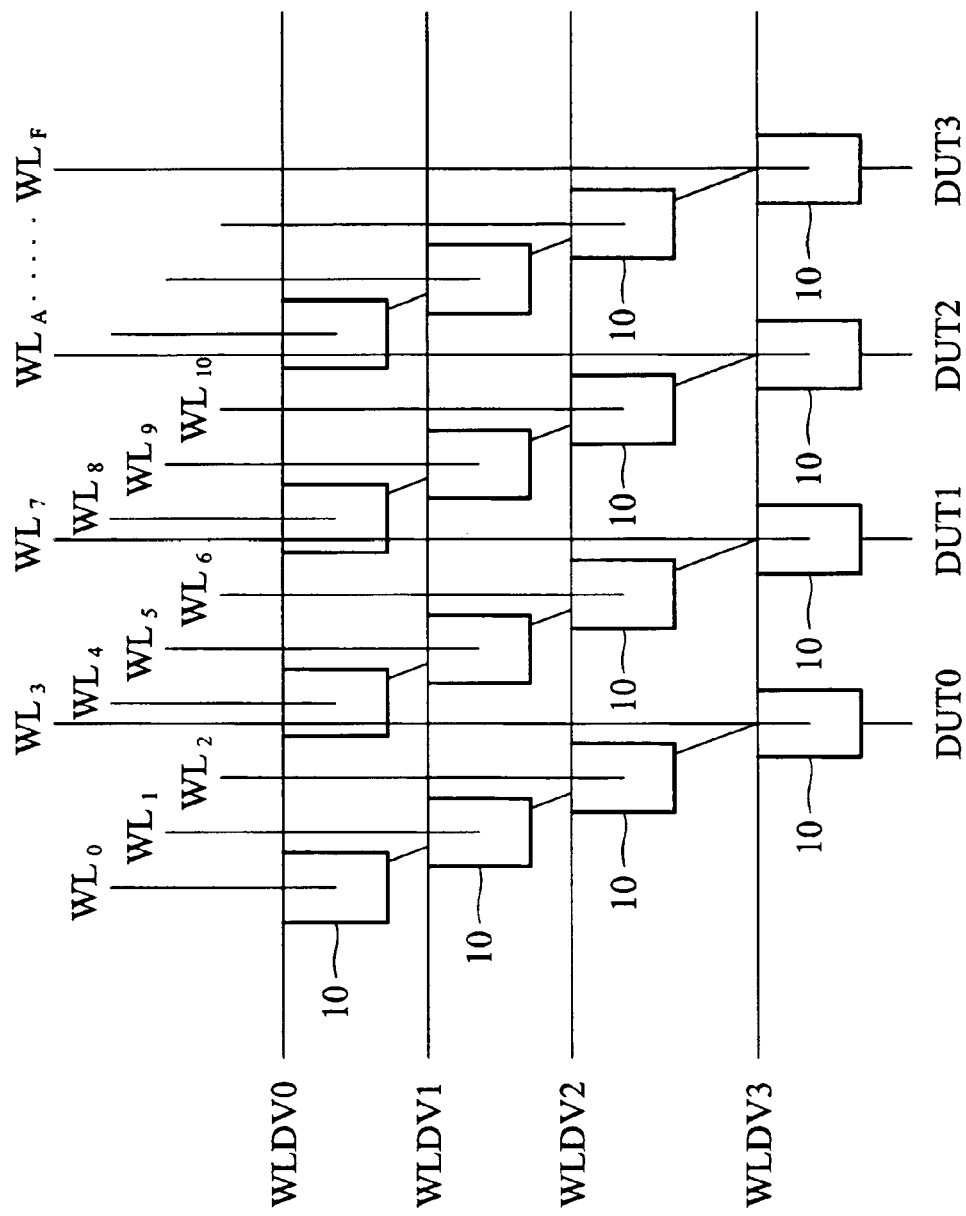
FIG. 3 shows a schematic diagram of a block of word lines in a DRAM.

For example (referring to FIG. 3 and FIG. 4), in the case of the present invention, when entering the test mode, word lines $WL_0$, $WL_4$, and $WL_8$ coupled to a driving line $WLDV_0$ are selected by a testing unit 11 (shown in FIG. 2.), than the testing unit 11 then pulls the voltage of corresponding control lines DOUT0, DOUT1 and DOUT2 to a low potential level to enable the control lines. Then, a command which can turn on one of the word lines is executed by the testing unit 11. If word line $WL_0$ is turned on, the corresponding driving line WLDV0 will be enabled by the testing unit 11, the driving signal will be pulled high, because the control lines DOUT0, DOUT1, and DOUT2 are enabled, so when the driving line WLDV0 is pulled to the high potential level. The driving signal is output to the corresponding word lines $WL_0$, $WL_4$, and $WL_8$. In other words, word lines $WL_0$, $WL_4$, and $WL_8$ are turned on.

After a predetermined time, a command for turning off the word line $WL_0$ is executed by the testing unit 11, and the driving line WLDV0 is disabled. The word lines $WL_0$, $WL_4$, and $WL_8$ are turned off. The control lines DOUT0, DOUT1, and DOUT2 are still in the enabled state. The word lines $WL_0$, $WL_4$, and $WL_8$ can be turned on/off repeatedly by the testing unit executing a "loop" command. Thus the word lines $WL_0$, $WL_4$, and $WL_8$ controlled by the enabled control lines are also turned on/off repeatedly.

The invention provides an improved method of driving and testing a memory device. According to the previously described method, the control lines corresponding to the word lines controlled by the same driving line can be enabled at the start of the test. When one of the word lines is turned on, the other word lines are also turned on. Moreover, the word lines are turned on simeltaneously. Additionally, because the control line remains in an enabled state after the word line is turned off, the word lines can be turned on and off repeatedly. Hence, the testing time is reduced while throughput is increased.

While the invention has been described by way of example and in terms of the preferred embodiments, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation to encompass all such modifications and similar arrangements.

What is claimed is:

1. A method of driving and testing a semiconductor memory device, wherein the semiconductor memory device comprises a plurality of word lines and corresponding driving circuits, and each driving circuit is controlled by a control line and a driving line:

entering a testing mode, selecting a plurality of word lines controlled by a driving line;

enabling control lines corresponding to the plurality of word lines;

enabling the driving line; and turning on the word lines, transferring a driving signal through the control lines to the word lines.

2. The method of driving and testing a semiconductor memory device as claimed in claim 1, further comprising after a predetermined time, disabling the driving line to turn off the word lines, while the control line remains in an enabled state.

3. The method of driving and testing a semiconductor memory device as claimed in claim 1, wherein the semiconductor memory device is a DRAM.

4. The method of driving and testing a semiconductor memory device as claimed in claim 1, wherein the voltage signal of the control lines is pulled to a low potential level to enable the control lines to couple to the selected word lines.

5. The method of driving and testing a semiconductor memory device as claimed in claim 1, wherein the voltage signal of the driving line is pulled from a low potential level to a high potential level to enable the driving line.

6. The method of driving and testing a semiconductor memory device as claimed in claim 2, wherein the voltage signal of the driving line is pulled from a high potential level to a low potential level to disable the driving line, and the control line remains at a high potential level.

* * * * *